(12) United States Patent
Kim et al.

(10) Patent No.: US 11,094,832 B2
(45) Date of Patent: Aug. 17, 2021

(54) SEMICONDUCTOR DEVICES

(71) Applicant: SAMSUNG ELECTRONICS CO., LTD., Suwon-si (KR)

(72) Inventors: Dahye Kim, Yongin-si (KR); Dongchan Suh, Suwon-si (KR); Jinbum Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/744,642

(22) Filed: Jan. 16, 2020

(65) Prior Publication Data
US 2020/0411698 A1 Dec. 31, 2020

(30) Foreign Application Priority Data
Jun. 25, 2019 (KR) .................. 10-2019-0075587

(51) Int. Cl.
*H01L 29/786* (2006.01)
*H01L 29/78* (2006.01)
(Continued)

(52) U.S. Cl.
CPC .... *H01L 29/78696* (2013.01); *H01L 29/0673* (2013.01); *H01L 29/4232* (2013.01); *H01L 29/42392* (2013.01); *H01L 29/66545* (2013.01); *H01L 29/7851* (2013.01); *H01L 29/7854* (2013.01)

(58) Field of Classification Search
CPC ........... H01L 29/0886; H01L 29/78696; H01L 29/0847; H01L 29/42392; H01L 29/7851; H01L 29/0673; H01L 29/66545; H01L 29/4232; H01L 29/7854; H01L 29/0843; H01L 29/0869
See application file for complete search history.

(56) References Cited

U.S. PATENT DOCUMENTS 6,046,464 A * 4/2000 Schetzina ............. H01L 33/007
257/96
9,252,275 B2 2/2016 Rachmady et al.
(Continued)

OTHER PUBLICATIONS

A. Hokazono et al. "Steep Channel & Halo Profiles, etc", IEEE 2008, 978j-1-4244-1805—Mar. 2008, 2008.
(Continued)

*Primary Examiner* — Feifei Yeung Lopez
(74) *Attorney, Agent, or Firm* — Lee IP Law, P.C.

(57) ABSTRACT

A semiconductor device includes an active region extending on a substrate in a first direction and including an impurity region, a plurality of channel layers vertically spaced apart from each other on the active region, a gate structure extending on the substrate in a second direction to intersect the active region and the plurality of channel layers, and surrounding the plurality of channel layers, a source/drain region disposed on the active region on at least one side of the gate structure and in contact with the plurality of channel layers, a barrier layer including a first barrier layer spaced apart from an upper surface of the active region and being disposed in the active region, and second barrier layers respectively disposed below the plurality of channel layers, and a contact plug connected to the source/drain region.

17 Claims, 16 Drawing Sheets

(51) Int. Cl.
*H01L 29/423* (2006.01)
*H01L 29/06* (2006.01)
*H01L 29/66* (2006.01)

(56) References Cited

U.S. PATENT DOCUMENTS

| | | |
|---|---|---|
| 9,793,403 B2 | 10/2017 | Obradovic et al. |
| 9,881,998 B1 | 1/2018 | Cheng et al. |
| 9,953,882 B2 | 4/2018 | Jacob |
| 10,115,788 B2 | 10/2018 | Ching et al. |
| 10,211,322 B1 | 2/2019 | Kim et al. |
| 2013/0270512 A1* | 10/2013 | Radosavljevic .. H01L 29/66469 257/9 |
| 2018/0301557 A1 | 10/2018 | Cheng et al. |
| 2018/0342596 A1 | 11/2018 | Lee et al. |
| 2020/0105872 A1* | 4/2020 | Glass ................. H01L 21/3081 |

OTHER PUBLICATIONS

G. Luo, et al. "Suppressing Phosphorus Diffusion, etc", Electronics Letters vol. 41. No. 24, Nov. 24, 2005.

\* cited by examiner

SEMICONDUCTOR DEVICES

CROSS-REFERENCE TO RELATED APPLICATION

Korean Patent Application No. 10-2019-0075587, filed on Jun. 25, 2019, in the Korean Intellectual Property Office, and entitled: "Semiconductor Devices," is incorporated by reference herein in its entirety.

BACKGROUND

1. Field

Embodiments relate to a semiconductor device.

2. Description of the Related Art

As demand for high performance, high speed, multifunctionalization, and/or the like in semiconductor devices increases, the degree of integration of semiconductor devices is increasing. In manufacturing semiconductor devices having a fine pattern to correspond to the tendency for high integration of semiconductor devices, patterns having fine widths or fine spacing may be implemented.

SUMMARY

Embodiments are directed to a semiconductor device, including an active region extending on a substrate in a first direction and including an impurity region, a plurality of channel layers vertically spaced apart from each other on the active region, a gate structure extending on the substrate in a second direction to intersect the active region and the plurality of channel layers, and surrounding the plurality of channel layers, a source/drain region disposed on the active region on at least one side of the gate structure and in contact with the plurality of channel layers, a barrier layer including a first barrier layer spaced apart from an upper surface of the active region and being disposed in the active region, and second barrier layers respectively disposed below the plurality of channel layers, and a contact plug connected to the source/drain region.

Embodiments are also directed to a semiconductor device, including a substrate including a first impurity region having first impurities of a first conductivity type, and a second impurity region including second impurities of a second conductivity type, a plurality of channel layers disposed to be vertically spaced apart from each other on each of the first and second impurity regions, first and second gate structures extending in one direction and intersecting the plurality of channel layers on each of the first and second impurity regions, and surrounding the plurality of channel layers, a first barrier layer disposed inside at least one of the first and second impurity regions and spaced apart from an upper surface of the substrate, and a second barrier layer disposed below at least one of the plurality of channel layers, above the first barrier layer.

Embodiments are also directed to a semiconductor device, including an active region extending on a substrate in a first direction and including an impurity region having first impurities, a channel layer disposed on the active region, a gate structure extending on the substrate in a second direction while intersecting the active region and the channel layer, the gate structure including a gate dielectric layer and a gate electrode layer, and a first barrier layer disposed in the active region to extend in the first direction, and including second impurities.

BRIEF DESCRIPTION OF DRAWINGS

Features will become apparent to those of skill in the art by describing in detail example embodiments with reference to the attached drawings in which.

DETAILED DESCRIPTION

Hereinafter, example embodiments will be described with reference to the accompanying drawings.

Figure 1:
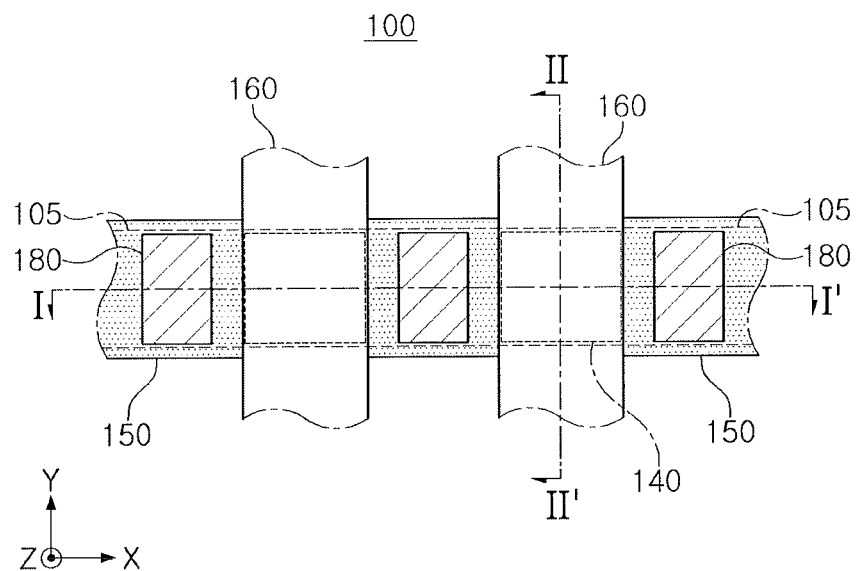
FIG. 1 illustrates a plan view of a semiconductor device according to an example embodiment.
Figure 2:
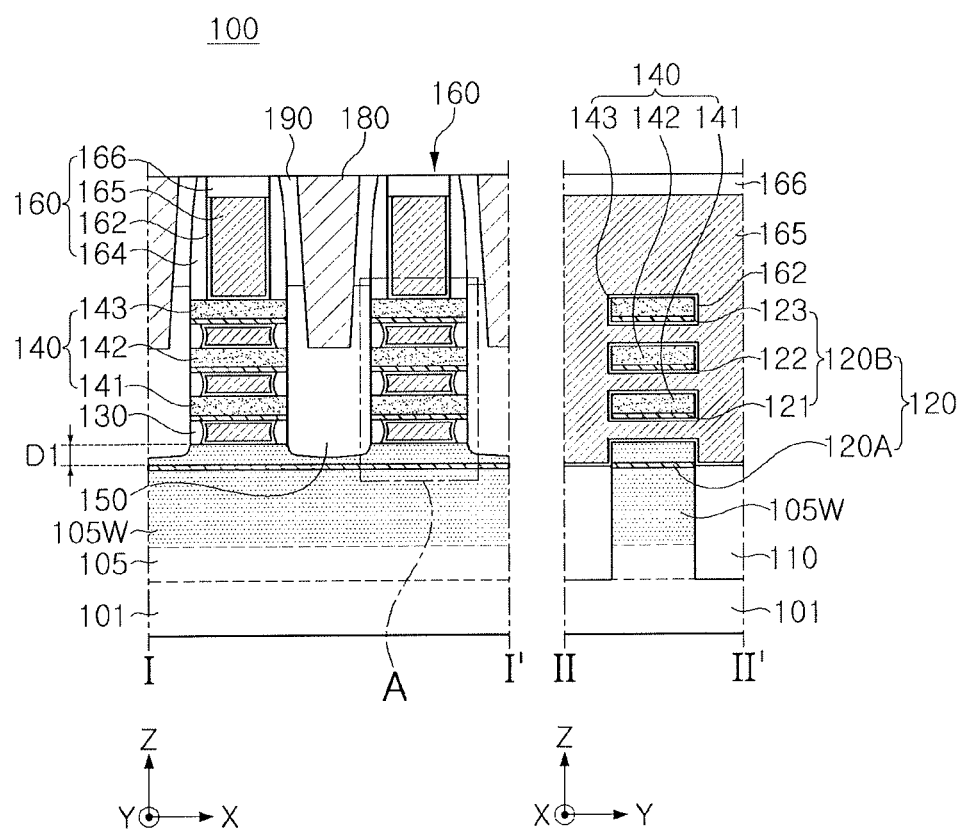
FIG. 2 illustrates a cross-sectional view of a semiconductor device according to an example embodiment.

FIG. 1 is a plan view illustrating a semiconductor device according to an example embodiment. FIG. 2 is a cross-sectional view illustrating a semiconductor device according to an example embodiment. In detail, FIG. 2 illustrates cross sections of the semiconductor device illustrated, taken along lines I-I' and II-II' in FIG. 1. For convenience of description, only main components of the semiconductor device are illustrated in FIGS. 1 and 2.

Referring to FIGS. 1 and 2, a semiconductor device 100 may include a substrate 101, an active region 105 on the substrate 101, channel structures 140 including a plurality of channel layers (e.g., a first channel layer 141, a second channel layer 142, and a third channel layer 143) disposed to be vertically spaced apart from each other above the active region 105, gate structures 160 extending to intersect the active region 105, source/drain regions 150 in contact with the plurality of channel layers 141, 142, and 143, a barrier layer 120 disposed in the active region 105 and below the channel layers 141, 142, and 143, and contact plugs 180 connected to the source/drain regions 150. The semiconductor device 100 may further include a device isolation layer 110, internal spacer layers 130, and an interlayer insulating layer 190. Each of the gate structures 160 may include a gate dielectric layer 162, a gate electrode 165, gate spacer layers 164, and a gate capping layer 166.

In the semiconductor device 100, the active region 105 may have a fin structure, and the gate electrode 165 may be disposed between the active region 105 and the channel structure 140, between the plurality of channel layers 141, 142, and 143 of the channel structures 140, and on an upper portion of the channel structure 140. Accordingly, the semiconductor device 100 may include a MBCFET (Multi Bridge Channel FET) including the channel structures 140, the source/drain regions 150, and the gate structures 160.

The substrate 101 may have an upper surface extending in an X direction and a Y direction. The substrate 101 may include a semiconductor material, such as a group IV semiconductor, a group III-V compound semiconductor, or a group II-VI compound semiconductor. For example, the group IV semiconductor may include silicon, germanium, or silicon-germanium. The substrate 101 may also be provided as a bulk wafer, an epitaxial layer, a silicon-on-insulator (SOI) layer, or a semiconductor-on-insulator (SeOI) layer.

The device isolation layer 110 may define the active region 105 in the substrate 101. The device isolation layer 110 may be formed by, for example, a shallow trench isolation (STI) process. According to an example embodiment, the device isolation layer 110 may further include an area having a step formed into a lower portion of the substrate 101 and extending relatively deeply. The device isolation layer 110 may partially expose an upper portion of the active region 105. In an example embodiment, the device isolation layer 110 may also have a curved upper surface having a relatively higher level as it is closer to the active region 105. The device isolation layer 110 may be formed of an insulating material. The device isolation layer 110 may be formed of, for example, an oxide, a nitride, or a combination thereof.

The active region 105 may be defined by the device isolation layer 110 in the substrate 101 and may be disposed to extend in a first direction, for example, the X direction. The active region 105 may have a protruding structure protruding from the substrate 101. An upper end of the active region 105 may be disposed to protrude to a predetermined height from an upper surface of the device isolation layer 110. The active region 105 may be formed of a portion of the substrate 101, or may include an epitaxial layer grown from the substrate 101. On both sides of the gate structures 160, the active region 105 on the substrate 101 may be partially recessed, and the source/drain regions 150 may be disposed on the recessed active region 105.

The active region 105 may include at least one impurity region 105W including impurities. The impurity region 105W may correspond to a well region of a transistor. For example, in the case of a p-type transistor (pFET), the impurity region 105W may include n-type impurities such as phosphorus (P), arsenic (As), or antimony (Sb), and in the case of an n-type transistor (nFET), the impurity region 105W may include p-type impurities such as boron (B), gallium (Ga), or aluminum (Al). The impurity region 105W may be located to have a predetermined depth from the upper surface of the active region 105 and the substrate 101. The position of the impurity region 105W may be determined differently depending on the concentration of impurities contained therein having a predetermined level or higher. Thus, the range of the impurity region 105W may be variously changed depending on the concentration criteria of the impurities.

The channel structure 140 may include two or more channels layers spaced apart from each other in a direction perpendicular to an upper surface of the active region 105, for example, in a Z direction, on the active region 105. The channel structure 140 may include the first to third channel layers 141, 142, and 143, which are a plurality of channel layers, for example. The first to third channel layers 141, 142, and 143 may be connected to the source/drain region 150 and spaced apart from the upper surface of the active region 105. The first to third channel layers 141, 142, and 143 may have the same or similar width as the active region 105 in the Y direction, and may have the same or similar width as the gate structure 160 in the X direction. In an example embodiment, the first to third channel layers 141, 142, and 143 may also have a reduced width in such a manner that side surfaces are positioned below the gate structure 160 in the X direction.

The first to third channel layers 141, 142, and 143 may be formed of a semiconductor material, and may include, for example, at least one of silicon (Si), silicon germanium (SiGe), and germanium (Ge). The first to third channel layers 141, 142, and 143 may be formed of, for example, the same material as a material of the substrate 101. In an example embodiment, the first to third channel layers 141, 142, and 143 may include an impurity region positioned in an area adjacent to the source/drain region 150. The number and shape of the channel layers 141, 142, and 143 constituting a single channel structure 140 may be variously changed in example embodiments. For example, according to an example embodiment, the channel structure 140 may further include a channel layer disposed on the upper surface of the active region 105.

The barrier layer 120 may include a first barrier layer 120A spaced apart from the upper surface of the active region 105 and disposed in the impurity region 105W, and first, second, and third layers 121, 122, and 123 of the second barrier layers 120B disposed under the channel layers 141, 142, and 143. The barrier layer 120 may prevent impurities in the impurity region 105W from diffusing into regions between the channel layers 141, 142, and 143, or may adjust a diffused amount of the impurities during a process of manufacturing the semiconductor device 100. During the manufacturing process, the gate structures 160 may be formed after sacrificial layers 115 (see FIG. 11C) are disposed and removed between the channel layers 141, 142, and 143. The barrier layer 120 may serve as a layer for preventing impurities in the impurity region 105W from diffusing into the sacrificial layers 115 from the impurity region 105W, which will be described in more detail with reference to FIGS. 11A to 11K below.

The barrier layer 120 may be an epitaxial layer grown from the active region 105. The barrier layer 120 may be formed of a material having a composition different from that of the active region 105 and the channel layers 141, 142, and 143. For example, the barrier layer 120 may include doping elements different from those of the active region 105 and the channel layers 141, 142, and 143, and may include a material capable of preventing diffusion of impurities in the impurity region 105W. In an example embodiment, the barrier layer 120 may include carbon (C), and may include, for example, silicon carbide (SiC), silicon germanium carbide (SiGeC), or a combination thereof. The content of carbon (C) in the barrier layer 120 may be about 3% or less of the total, and carbon (C) may be included, for example, at a ratio of about 0.02% to 3%. The concentration of carbon (C) in the barrier layer 120 may be about $1.8 \times 10^{21}/cm^3$ or less. If the concentration of carbon (C) is higher than the above range, crystallinity of the channel structure 140 grown on the barrier layer 120 may be lowered. If the concentration of carbon (C) is lower than the above range, the effect of preventing the diffusion of impurities may be lowered. The first barrier layer 120A and the second barrier layers 120B may have the same or different carbon concentrations. For example, when the first barrier layer 120A and the second barrier layers 120B have different carbon concentrations, the concentration of carbon in the first barrier layer 120A may be higher than the concentration of carbon of the second barrier layers 120B.

The layers constituting the barrier layer 120 may have substantially the same thickness as each other, for example. Each of the layers constituting the barrier layer 120 may have a thickness of about 10 nm or less, for example, in the range of about 1 nm to about 3 nm. If the thickness of the barrier layer 120 is greater than that in the above range, the size of the semiconductor device 100 may be increased, and if the thickness of the barrier layer 120 is less than that in the above range, the effect of preventing diffusion of impurities may be reduced.

The first barrier layer 120A may extend in the X direction, an extension direction of the active region 105, in the active region 105. For example, the first barrier layer 120A may be disposed as one layer that extends continuously without being separated in the lower portions of the adjacent gate structures 160. Accordingly, the first barrier layer 120A may be disposed to overlap the source/drain region 150 on a plane, and may be disposed to be lower than the source/drain region 150 on a cross section. The first barrier layer 120A may block impurities in the impurity region 105W from diffusing to the upper part during the manufacturing process. Thus, the first barrier layer 120A may be positioned to be higher than a region having a maximum concentration of impurities in the impurity region 105W. Therefore, in the impurity region 105W, a maximum concentration of impurities in an upper region of the first barrier layer 120A may be lower than a maximum concentration of impurities in a lower region of the first barrier layer 120A. The first barrier layer 120A may be spaced apart from the upper surface of the substrate 101 and the active region 105 downwardly by a first distance Dl. Both the upper and lower surfaces of the first barrier layer 120A may contact the active region 105.

The second barrier layers 120B may include first to third layers 121, 122, and 123 disposed below the first to third channel layers 141, 142, and 143, respectively. The second barrier layers 120B may be disposed below the channel layers 141, 142, and 143, respectively, while having substantially the same width as that of the channel layers 141, 142, and 143 in the X direction and the Y direction.

The second barrier layers 120B may be configured to be disposed between the channel layers 141, 142, and 143 and the sacrificial layers 115 during the manufacturing process, in consideration of lattice constants of the barrier layer 120, the channel layers 141, 142, and 143, and the sacrificial layers 115. In a case in which layers having a relatively large difference in lattice constant are arranged up and down with each other, crystallinity of upper layers may be degraded due to lattice mismatch. Accordingly, the second barrier layers 120B may help reduce a difference in lattice constant between layers adjacent to each other in a vertical direction.

For example, consider a case where the second barrier layers 120B are formed of silicon carbide (SiC), the channel layers 141, 142, and 143 are formed of silicon (Si), and the sacrificial layers 115 are formed of silicon germanium (SiGe). The lattice constant of silicon carbide (SiC) is about 4.4 Å. The lattice constant of silicon (Si) is about 5.4 Å. The lattice constant of germanium (Ge) is about 5.7, which is greater than that of silicon (Si). In this case, since the second barrier layers 120B are disposed below the channel layers 141, 142, and 143 rather than below the sacrificial layers 115, crystallinity of the entire structure including the second barrier layers 120B, the sacrificial layers 115 and the channel layers 141, 142, and 143 may be improved. Accordingly, the first, second, and third layers 121, 122, and 123 of the second barrier layers 120B may be disposed between the first to third channel layers 141, 142, and 143 and the gate structures 160 therebelow, respectively. The second barrier layers 120B may be disposed to be in contact with the internal spacer layers 130, the source/drain regions 150, and the gate dielectric layers 162 of the gate structures 160, in addition to the channel structure 140. Since the sacrificial layer 115 is not disposed on the third layer 123, the third layer 123 does not block the diffusion of impurities into the sacrificial layer 115, but may serve to secure electrical characteristics by allowing growth conditions of the first to third channel layers 141, 142, and 143 to be similar to each other.

The source/drain regions 150 may be disposed on the active region 105 at both sides of the channel structure 140. The source/drain region 150 may be disposed to cover respective sides of the first to third channel layers 141, 142, and 143 of the channel structure 140 and an upper surface of the active region 105 provided therebelow. Although the source/drain region 150 may be formed by partially recessing an upper portion of the active region 105, in an example embodiment, the formation of the recess and the recess depth may be variously changed. The source/drain regions 150 may be a semiconductor layer including silicon (Si), and may include impurities of different kinds and/or concentrations.

The gate structure 160 may be configured to extend in one direction, for example, the Y direction, while intersecting the active region 105 and the channel structures 140 above the active region 105 and the channel structures 140. Channel regions of transistors may be formed in the active region 105 and/or the channel structures 140 intersecting the gate structure 160. The gate structure 160 may include the gate electrode 165, a gate dielectric layer 162 between the gate electrode 165 and the plurality of channel layers 141, 142, and 143, and gate spacer layers 164 on side surfaces of the gate electrode 165. The gate structure 160 may include a gate capping layer 166 on an upper surface of the gate electrode 165. The gate structure 160 may be disposed between the channel structures 140, in such a manner that upper surfaces thereof are in contact with the first to third layers 121, 122, and 123 of the second barrier layer 120B, and lower surfaces thereof are in contact with the channel layers 141, 142, and 143, respectively.

The gate dielectric layer 162 may be disposed between the active region 105 and the gate electrode 165. and between the channel structure 140 and the gate electrode 165. The gate dielectric layer 162 may be disposed to cover at least a portion of surfaces of the gate electrode 165. For example, the gate dielectric layer 162 may be disposed to surround all surfaces except an uppermost surface of the gate electrode 165. The gate dielectric layer 162 may extend between the gate electrode 165 and the gate spacer layers 164, for example. The gate dielectric layer 162 may include an oxide, a nitride, or a high-k material. The high-k material may refer to a dielectric material having a dielectric constant higher than that of silicon oxide ($SiO_2$). The high-k material may be any one of, for example, aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$).

The gate electrode 165 may be configured to fill gaps between the plurality of channel layers 141, 142, and 143, above the active region 105 and extend upwardly of the channel structure 140. The gate electrode 165 may be spaced apart from the plurality of channel layers 141, 142, and 143 by the gate dielectric layer 162. The gate electrode 165 may include a conductive material, for example, a metal nitride such as titanium nitride (TiN), tantalum nitride (TaN) or tungsten nitride (WN), and/or a metal such as aluminum (Al), tungsten (W), or molybdenum (Mo), or a semiconductor material such as doped polysilicon. The gate electrode 165 may include one or more layers, for example, two or more multilayers. The gate electrode 165 may be separated by a separator that is disposed between at least some adjacent transistors depending on the configuration of the semiconductor device 100.

The gate spacer layers 164 may be disposed on both or opposite sides of the gate electrode 165. The gate spacer layers 164 may insulate the source/drain regions 150 from the gate electrodes 165. The gate spacer layers 164 may be formed to have a multilayer structure. The gate spacer layers 164 may be formed of an oxide, a nitride, or an oxynitride. The gate spacer layers 164 may be formed of a low dielectric constant film.

The gate capping layer 166 may be disposed on the gate electrode 165, and the lower and side surfaces of the gate capping layer 166 may be surrounded by the gate electrode 165 and the gate spacer layers 164, respectively.

The internal spacer layers 130 may be disposed in parallel with the gate electrode 165 between the channel structures 140. Below the third channel layer 143, the gate electrode 165 may be separated from the source/drain regions 150 by the internal spacer layers 130 so as to be electrically isolated therefrom. The internal spacer layers 130 may have a shape in which a side surface thereof facing the gate electrode 165 is convexly rounded inward toward the gate electrode 165, for example. The internal spacer layers 130 may be formed of oxide, nitride, or oxynitride. The internal spacer layers 130 may be formed of a low dielectric constant film.

The contact plug 180 may penetrate through the interlayer insulating layer 190 to be connected to the source/drain region 150, and may apply an electrical signal to the source/drain region 150. The contact plug 180 may be disposed on the source/drain region 150 as illustrated in FIG. 1, and may also have a length greater than a length of the source/drain region 150 in the Y direction. The contact plug 180 may have an inclined side surface in which a width of a lower portion is narrower than a width of an upper portion depending on an aspect ratio, for example. The contact plug 180 may extend from the upper portion to be lower than, for example, the third channel layer 143. The contact plug 180 may be recessed to a height corresponding to the upper surface of the second channel layer 142, for example. In an example embodiment, the contact plug 180 may also be disposed to contact along an upper surface of the source/drain region 150 without recessing the source/drain region 150. The contact plug 180 may include, for example, a metal nitride such as titanium nitride (TiN), tantalum nitride (TaN) or tungsten nitride (WN), and/or a metal such as aluminum (Al), tungsten (W), or molybdenum (Mo).

The interlayer insulating layer 190 may cover the source/drain regions 150 and the gate structures 160, and may be disposed to cover the device isolation layer 110 in a region not illustrated. The interlayer insulating layer 190 may include at least one of, for example, an oxide, a nitride, and an oxynitride, and may include a low dielectric constant material.

Figure 3A:
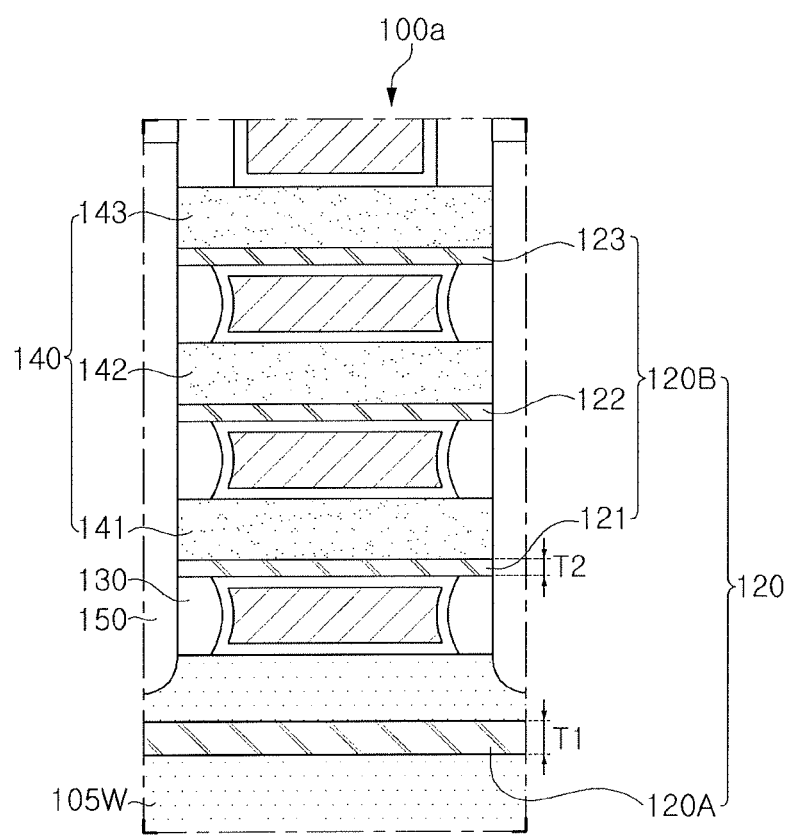
FIGS. 3A and 3B illustrate enlarged partial views of portions of semiconductor devices according to example embodiments.
Figure 3B:
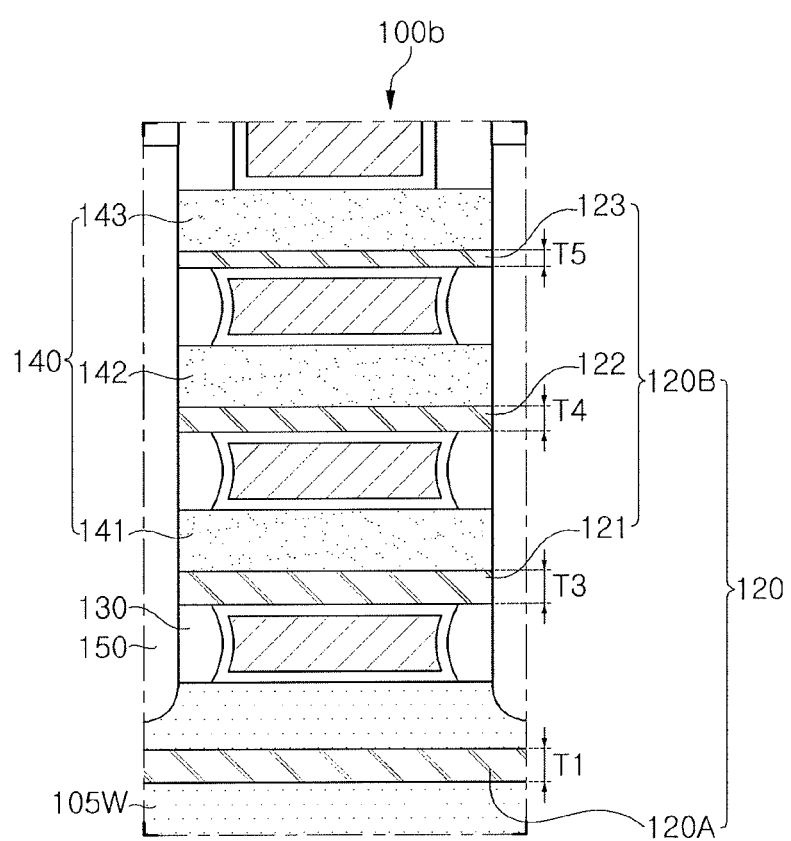

FIGS. 3A and 3B are enlarged partial views illustrating portions of semiconductor devices according to example embodiments. FIGS. 3A and 3B illustrate enlarged views of an area corresponding to area A of FIG. 2.

Referring to FIG. 3A, in a semiconductor device 100a, a first barrier layer 120A may have a thickness different from that of each of second barrier layers 120B. For example, the first barrier layer 120A may have a first thickness T1, and each of the second barrier layers 120B may have a second thickness T2 that is less than the first thickness T1. In this case, since the first barrier layer 120A disposed adjacently to an impurity region 105W has a relatively greater thickness, the diffusion of impurities in the lower portion adjacent to the impurity region 105W may be more effectively blocked.

Referring to FIG. 3B, in a semiconductor device 100b, second barrier layers 120B may have different thicknesses. For example, a first layer 121 may have a third thickness T3, a second layer 122 disposed above the first layer 121 may have a fourth thickness T4 that is less than the third thickness T3, and a third layer 123 above the second layer 122 may have a fifth thickness T5 that is less than the fourth thickness T4. The third thickness T3 of the first layer 121 may be equal to or less than the first thickness T1 of the first barrier layer 120A. In this case, since the second barrier layers 120B disposed relatively adjacent to the impurity region 105W have a relatively greater thickness, diffusion of impurities may be more efficiently blocked at a lower portion having a relatively high content of impurities.

Figure 4:
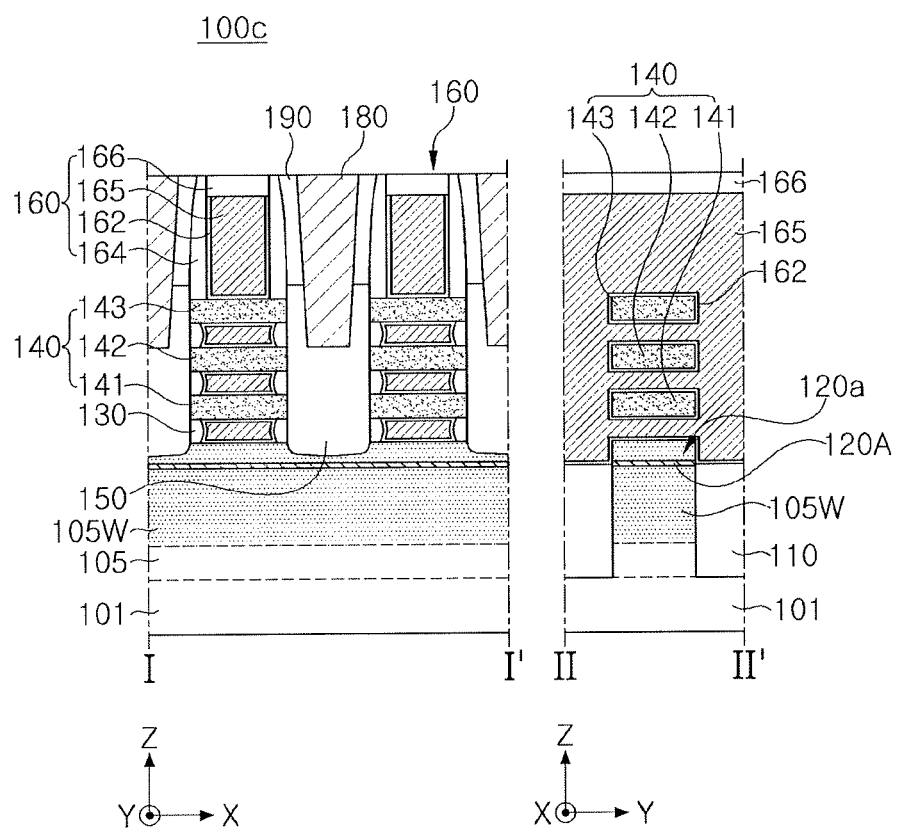
FIGS. 4 and 6 illustrate cross-sectional views of semiconductor devices according to example embodiments.
Figure 5:
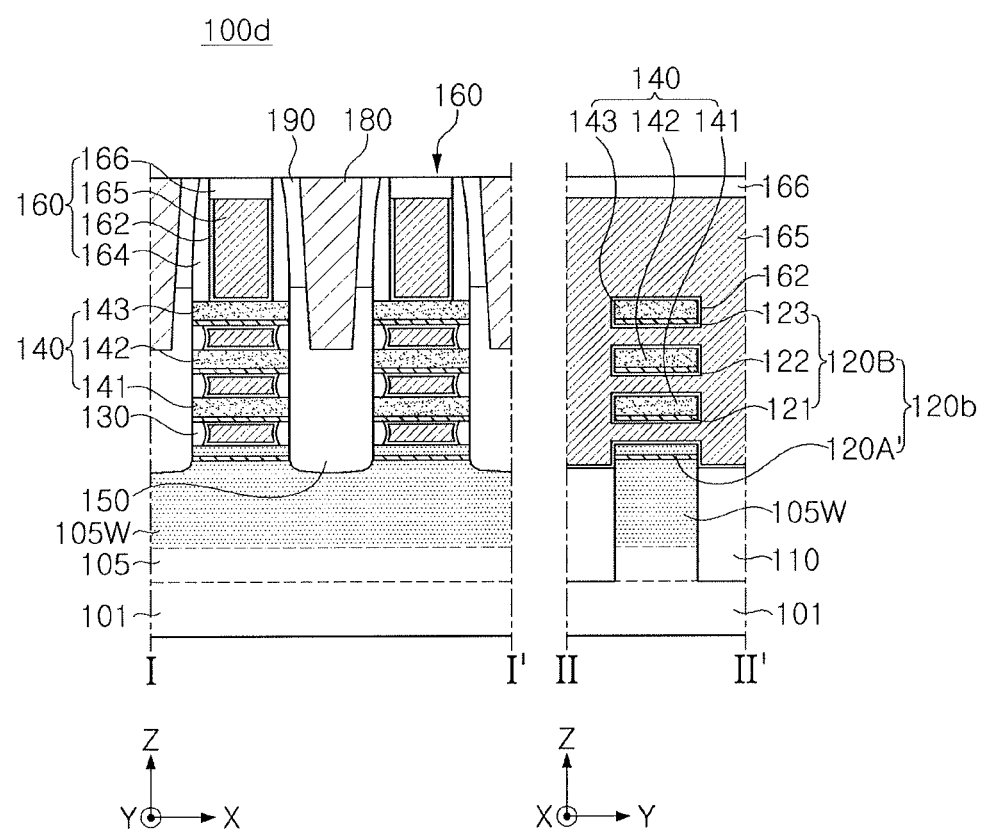
Figure 6:
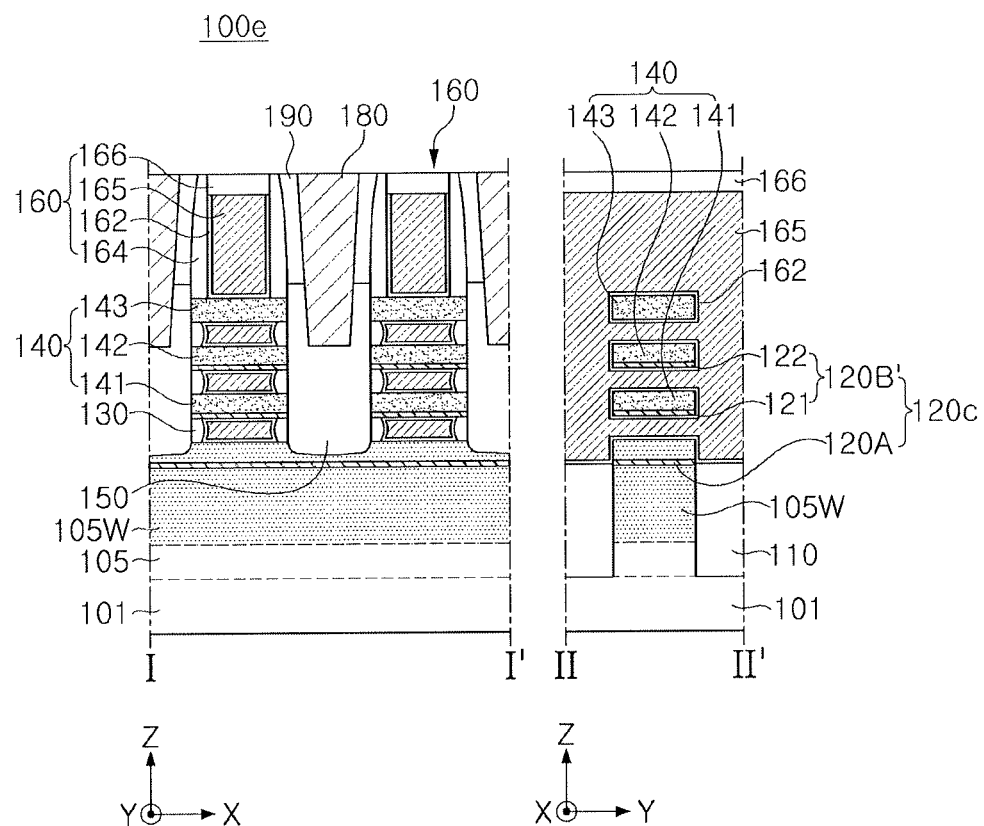

FIGS. 4 through 6 are cross-sectional views illustrating semiconductor devices according to example embodiments. FIGS. 4 to 6 illustrate regions corresponding to cross sections taken along lines I-I' and II-II' of FIG. 1.

Referring to FIG. 4, in a semiconductor device 100c, a barrier layer 120a may not include second barrier layers 120B (see FIG. 2) and may only include a first barrier layer 120A. The first barrier layer 120A may be formed to block diffusion of impurities to a predetermined level, and the second barrier layers 120B may be omitted.

In an example embodiment, such a structure may also be formed by removing the second barrier layers 120B during a process of manufacturing the semiconductor device 100c. In this case, although the semiconductor device 100c does not include the second barrier layers 120B, in each of first to third channel layers 141, 142, and 143, a lower region may partially include carbon that is diffused from the second barrier layers 120B. In an example embodiment, the second barrier layers 120B may also remain only on upper portions of the internal spacer layers 130.

Referring to FIG. 5, in a semiconductor device 100d, a first barrier layer 120A' of a barrier layer 120b may be divided into a plurality of layers and thus may be disposed as the plurality of layers between adjacent gate structures 160 in the X direction. In an example embodiment, such a structure may be formed as the first barrier layer 120A' is formed on a relatively high level or the source/drain region 150 is formed in such a manner that the active region 105 is recessed relatively deeply. Accordingly, the first barrier layer 120A' may be in contact with the source/drain region 150 through sides thereof, and may be disposed not to overlap the source/drain region 150 on a plane.

Referring to FIG. 6, in a semiconductor device 100e, a barrier layer 120c includes the first barrier layer 120A and a second barrier layer 120B', and the second barrier layer 120B' may include the first layer 121 below the first channel layer 141 and the second layer 122 below the second channel layer 142. In this example embodiment, as compared to the example embodiment of FIG. 2, the second barrier layer 120B' may not be disposed below an uppermost channel layer, for example, the third channel layer 143. Accordingly, a lower surface of the third channel layer 143 may be in direct contact with the gate structure 160.

When an effect of blocking diffusion of impurities is secured by the first and second layers 121 and 122 and electrical characteristics are secured by the first to third channel layers 141, 142, and 143, the third layer 123 (see FIG. 2) may be omitted as in this example embodiment.

Figure 7:
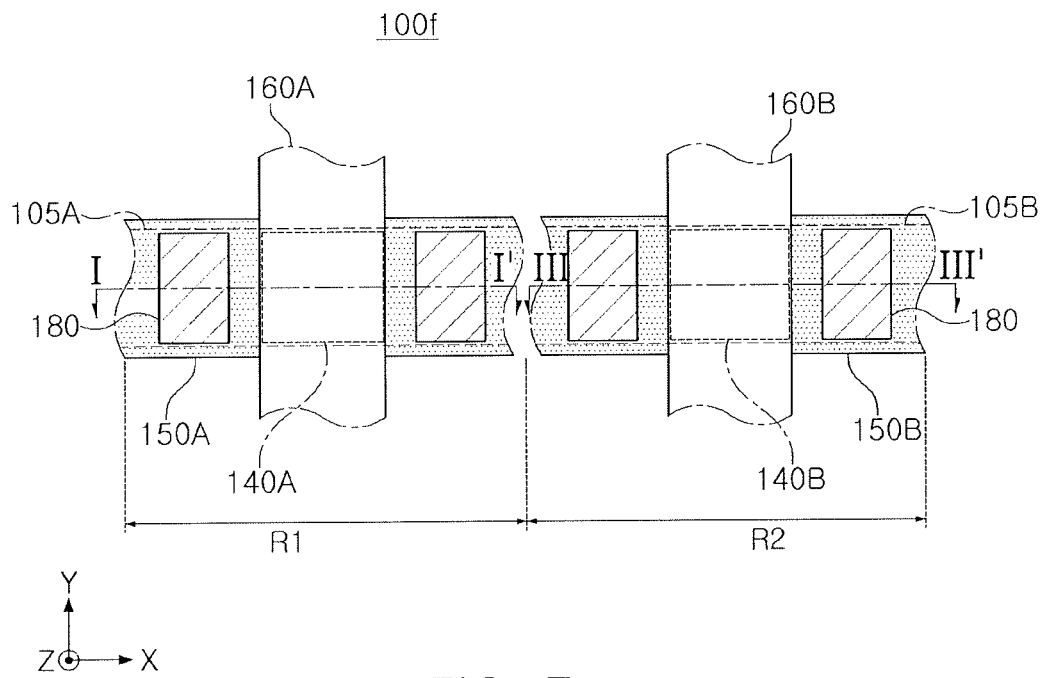
FIG. 7 illustrates a plan view of a semiconductor device according to an example embodiment.
Figure 8:
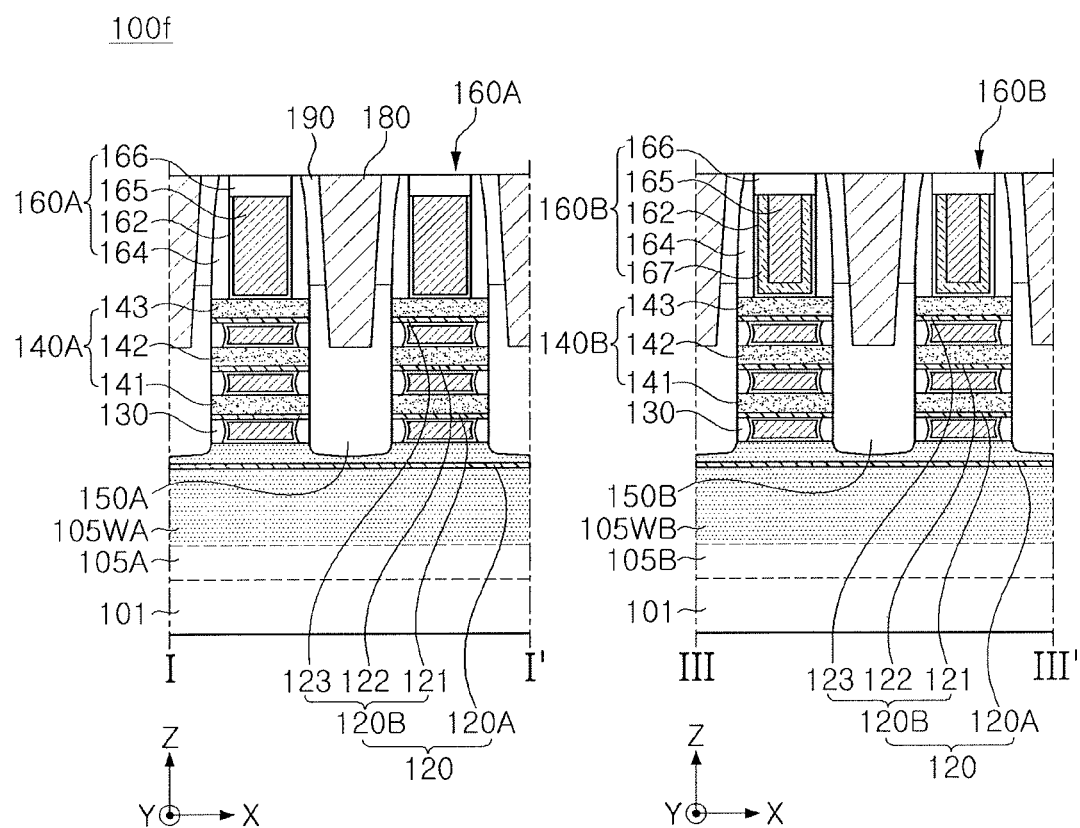
FIG. 8 illustrates a cross-sectional view of a semiconductor device according to an example embodiment.

FIG. 7 is a plan view illustrating a semiconductor device according to an example embodiment and FIG. 8 illustrates cross sections taken along lines I-I' and of the semiconductor device in FIG. 7.

Referring to FIGS. 7 and 8, a semiconductor device 100f may have first and second regions R1 and R2. The first and second regions R1 and R2 may include first and second active regions 105A and 105B, first and second channel structures 140A and 140B, first and second source/drain regions 150A and 150B, and first and second gate structures 160A and 160B, respectively. The barrier layers 120 may be disposed in the same structure in the first and second regions R1 and R2. Hereinafter, a description thereof overlapping with the description above with reference to FIGS. 1 and 2 may be omitted.

The first and second active regions 105A and 105B may include first and second impurity regions 105WA and 105WB, respectively. The first and second impurity regions 105WA and 105WB may have different conductivity-types of impurities. The first and second channel structures 140A and 140B may include impurities of different conductivity types, or may not include impurities. The first and second source/drain regions 150A and 150B may also include impurities of different conductivity types. For example, a first transistor disposed in the first region R1 may be a pFET, and a second transistor disposed in the second region R2 may be an nFET.

In an example case in which the first impurity regions 105WA include phosphorus (P) and the second impurity region 105WB includes boron (B), the diffusivity of phosphorus (P) may be higher than that of boron (B). Thus, a diffusion amount of phosphorus (P) into sacrificial layers 115 (see FIG. 11C) in the first region R1 may be relatively higher than that of boron (B). In this case, thus, the etching rates of the sacrificial layers 115 in the first and second regions R1 and R2 may be different in a process of removing the sacrificial layers 115 during the process of manufacturing the semiconductor device 100f. For example, the sacrificial layers 115 may remain in the first region R1 without being completely removed. However, according to an example embodiment, the barrier layer 120 is provided and occurrence of a difference in the etching rate of the sacrificial layers 115 in the first and second regions R1 and R2 may be prevented.

The first and second gate structures 160A and 160B may have different electrode layer structures and may include different conductive materials. For example, the second gate structures 160B may further include a work function control layer 167 below the gate electrode 165. The work function control layer 167 may function as a gate electrode together with the gate electrode 165, and may include a conductive material such as a metal. The second gate structures 160B may function as an electrode having a work function different from that of the first gate structures 160A by including the work function control layer 167. The work function control layer 167 may be disposed to cover lower and side surfaces of the gate electrode 165, for example.

Figure 9:
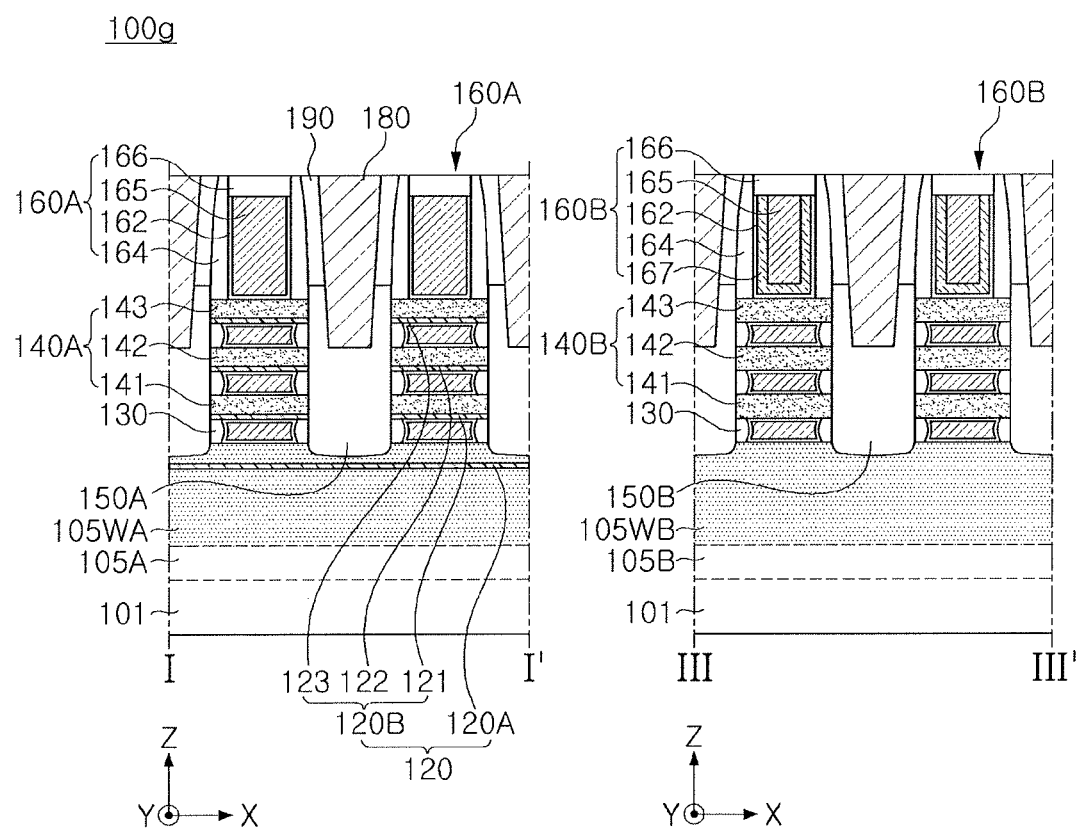
FIG. 9 illustrates a cross-sectional view of a semiconductor device according to an example embodiment.

FIG. 9 is a cross-sectional view illustrating a semiconductor device according to an example embodiment. FIG. 9 illustrates regions corresponding to cross sections taken along lines I-I' and III-III' of FIG. 7.

Referring to FIG. 9, in a semiconductor device 100g, as compared to the example embodiment of FIG. 8, a second region R2 does not include the barrier layer 120, and the barrier layer 120 may only be disposed in a first region R1. The first and second impurity regions 105WA and 105WB may include different impurities. Thus, in a case in which the diffusion of impurities of a specific type or a specific element is problematic, the barrier layer 120 may be disposed only in one region. For example, when the first impurity region 105WA includes phosphorus (P) and the second impurity region 105WB includes boron (B), the barrier layer 120 may only be disposed in the first region R1, thereby blocking only diffusion of phosphorus (P) having a relatively high diffusivity.

Figure 10A:
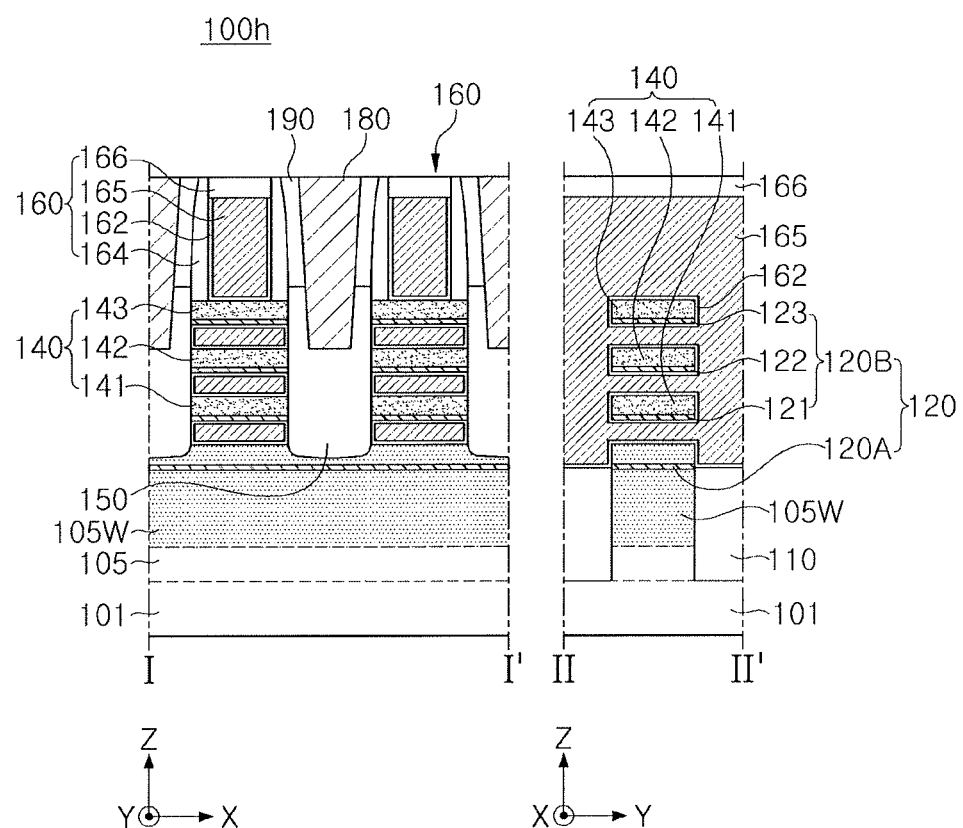
FIGS. 10A to 10C illustrate cross-sectional views of semiconductor devices according to an example embodiment.
Figure 10B:
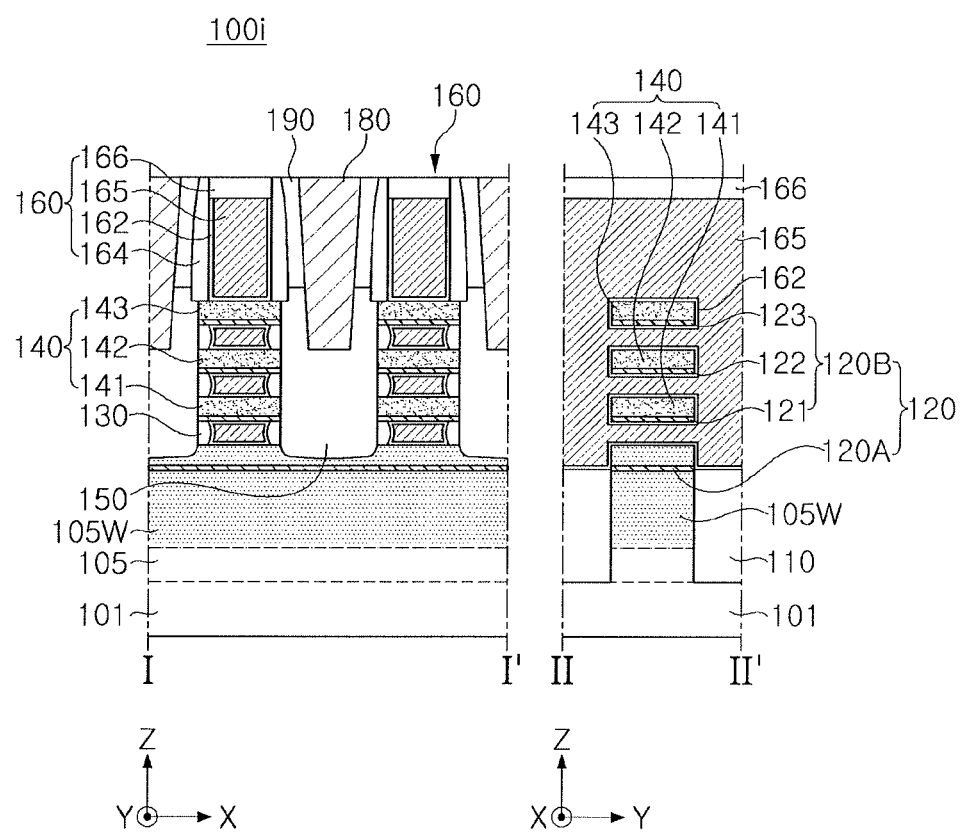
Figure 10C:
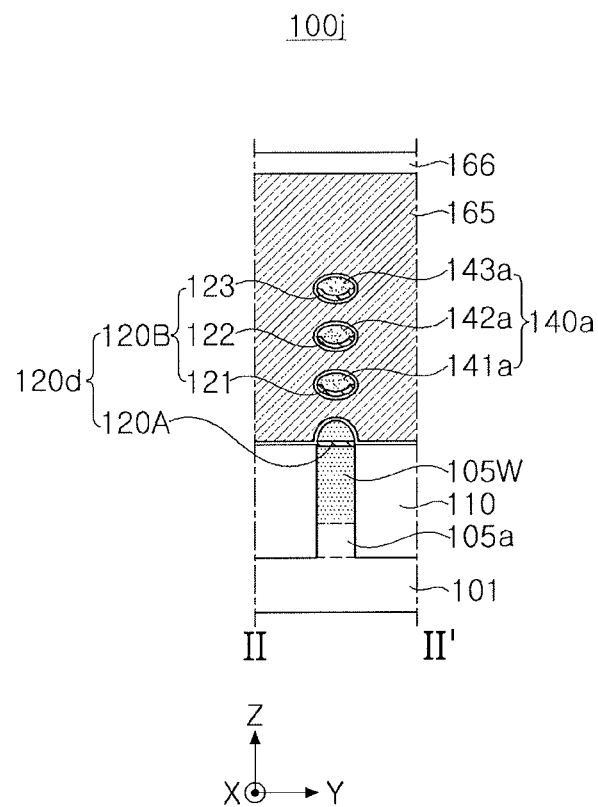

FIGS. 10A to 10C are cross-sectional views illustrating semiconductor devices according to an example embodiment. FIGS. 10A and 10B illustrate regions corresponding to cross sections taken along lines I-I' and II-II' of FIG. 1, and FIG. 10C illustrates a region corresponding to a cross section taken along line II-II' of FIG. 1.

Referring to FIG. 10A, as compared to the example embodiment described above with reference to FIG. 2, a semiconductor device 100h may not include the internal spacer layer 130. The gate electrode 165 may be extended in the X direction between first to third channel layers 141, 142, and 143 of a channel structure 140. Accordingly, both sides of the gate structure 160 in the X direction may be disposed in parallel with both sides of the channel structure 140 and both sides of second barrier layers 120B in a vertical direction, and may form a substantially coplanar surface therewith.

Referring to FIG. 10B, as compared to the example embodiment described above with reference to FIG. 2, in the case of a semiconductor device 100i, both sides of channel structures 140, internal spacer layers 130 and second barrier layers 120B in the X direction may be located below the gate structures 160. For example, the channel structures 140 and the second barrier layers 120B may have a width narrower than that of the gate structure 160. In FIG. 10B, both sides of the channel structures 140, the internal spacer layers 130 and the second barrier layers 120B in the X direction are illustrated as being disposed below the gate spacer layers 164, but the sides may also be located below the gate electrode 165 according to an example embodiment.

Referring to FIG. 10C, in a semiconductor device 100j, widths of an active region 105a, a channel structure 140a, and a barrier layer 120d may be different from those in the example embodiment of FIG. 2. The active region 105a, the channel structure 140a, and the barrier layer 120d may have a relatively narrow width, and thus a plurality of channel layers 141a, 142a, and 143a of the channel structure 140a may each have a circular shape or an elliptical shape of which a difference in the length of a long axis and a short axis is relatively low in the cross section in the Y direction. Accordingly, the second barrier layers 120B may also be configured to have upper and lower curved surfaces corresponding to the channel layers 141a, 142a, and 143a. For example, in the example embodiment of FIG. 2, the plurality of channel layers 141, 142, and 143 may have a width of about 20 nm to 50 nm in the Y direction, and the plurality of channel layers 141a, 142a, and 143a in this example embodiment may have a width of about 3 nm to 12 nm in the Y direction. As such, in example embodiments, the width of the active region 105a and the channel structure 140a and the shape thereof based on the width may be variously changed.

FIGS. 11A through 11K are diagrams illustrating stages in a method of manufacturing a semiconductor device according to an example embodiment, and show cross-sections corresponding to FIG. 2.

Figure 11A:
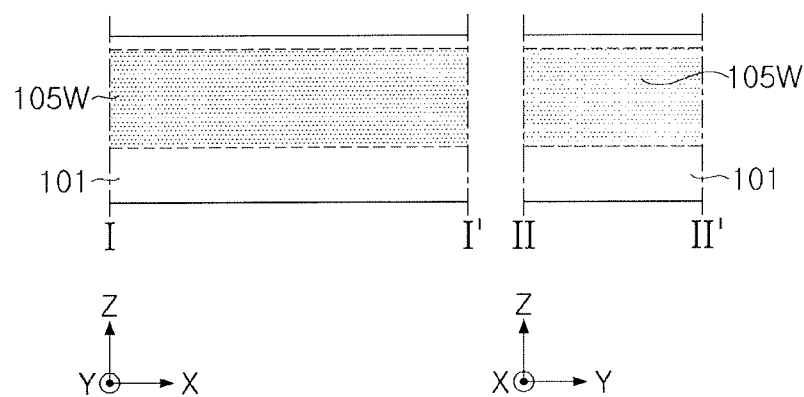
FIGS. 11A to 11K illustrate views of stages in a method of manufacturing a semiconductor device according to an example embodiment.

Referring to FIG. 11A, the impurity region 105W may be formed in the substrate 101.

The impurity region 105W may be formed by an ion implantation process, and may be formed to have a maximum impurity concentration in a region spaced apart from an upper surface of the substrate 101 by a predetermined depth. Impurities in the impurity region 105W may diffuse through high temperature processes in processes of manufacturing a semiconductor device, and thus the impurity region 105W may also be expanded. On the other hand, in an example embodiment, the impurity region 105W may also be formed not to be spaced apart from the upper surface of the substrate 101 from the time of formation.

Figure 11B:
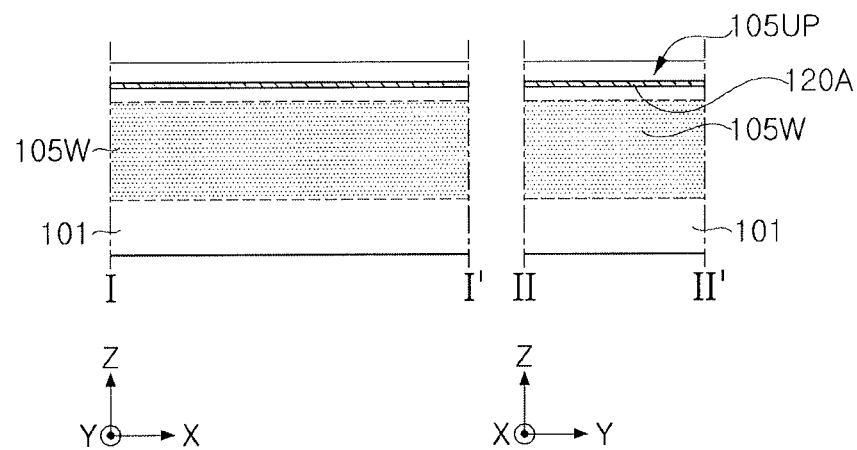

Referring to FIG. 11B, the first barrier layer 120A may be formed on the substrate 101, and an upper active region 105UP may be formed on the first barrier layer 120A.

The first barrier layer 120A may be formed by performing an epitaxial growth process using the substrate 101 as a seed. When the first barrier layer 120A is formed, the first barrier layer 120A may be formed to include, for example, carbon (C) by using in-situ doping or the like.

Next, the upper active region 105UP constituting a portion of the active region 105 may be formed on the first barrier layer 120A by an epitaxial growth process. Accordingly, crystallinity of a lower portion and an upper portion of the active region 105 may be different based on the first barrier layer 120A.

Figure 11C:
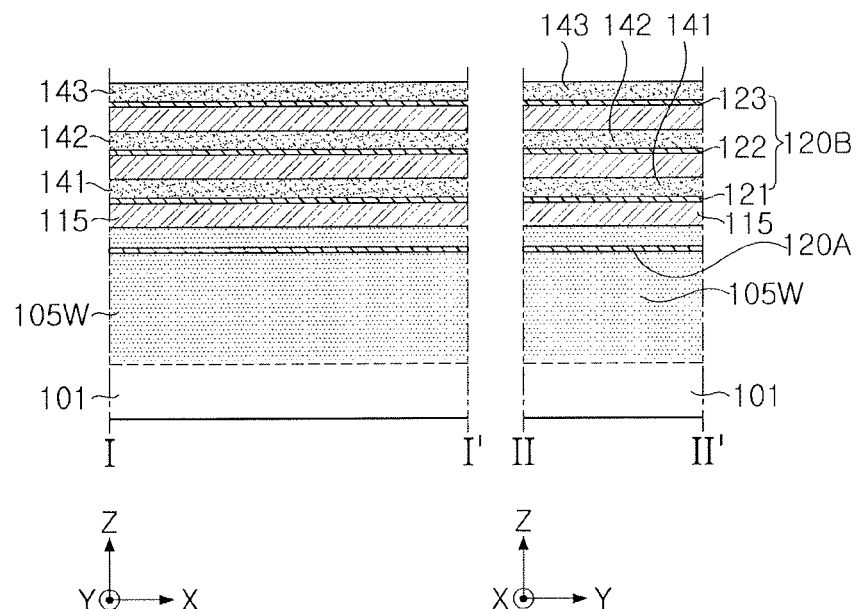

Referring to FIG. 11C, sacrificial layers 115, the second barrier layers 120B, and the channel layers 141, 142, and 143 may be alternately stacked on the substrate 101.

The sacrificial layers 115 may be layers to be replaced with the gate dielectric layer 162 and the gate electrode 165 (as illustrated in FIG. 2) through a subsequent process. The sacrificial layers 115 may be formed of a material having an etch selectivity with respect to the channel layers 141, 142, and 143 and the second barrier layers 120B, respectively. The channel layers 141, 142, and 143 may include a material different from a material of the sacrificial layers 115 and the second barrier layers 120B. The sacrificial layers 115 and the channel layers 141, 142, and 143 may include different semiconductor materials and may include at least one of, for example, silicon (Si), silicon germanium (SiGe), and germanium (Ge), and may contain or may not contain impurities or dopants. For example, the sacrificial layers 115 may include silicon germanium (SiGe), the channel layers 141, 142, and 143 may include silicon (Si), and the second barrier layers 120B may include silicon carbide (SiC). In this operation, the impurity region 105W may extend to the surface of the substrate 101 by diffusion of impurities in the impurity region 105W due to a process temperature, and may also extend downward in the substrate 101. The range of the impurity region 105W may be variously changed in example embodiments.

The sacrificial layers 115, the second barrier layers 120B, and the channel layers 141, 142, and 143 may be formed by performing an epitaxial growth process from the active region 105. Each of the sacrificial layers 115 and the channel layers 141, 142, and 143 may have a thickness in a range of, for example, about 1 Å to 100 nm. The second barrier layers 120B may have a thickness of about 10 nm or less. The number of layers of the channel layers 141, 142, and 143 alternately stacked with the sacrificial layer 115 may be variously changed according to an example embodiment, and thus, the number of layers of the second barrier layers 120B disposed below the channel layers 141, 142, and 143 may also be changed.

In this operation, the channel layers 141, 142, and 143 may be grown on upper portions of the second barrier layers 120B and may contact the second barrier layers 120B. Lattice constants of the second barrier layers 120B may have a value closer to lattice constants of the channel layers 141, 142, and 143 than lattice constants of the sacrificial layers 115. Thus, when the channel layers 141, 142, and 143 are formed on the second barrier layers 120B and the sacrificial layers 115 are formed on the channel layers 141, 142, and 143, the lattice constants may be sequentially increased and crystallinity may be secured.

Figure 11D:
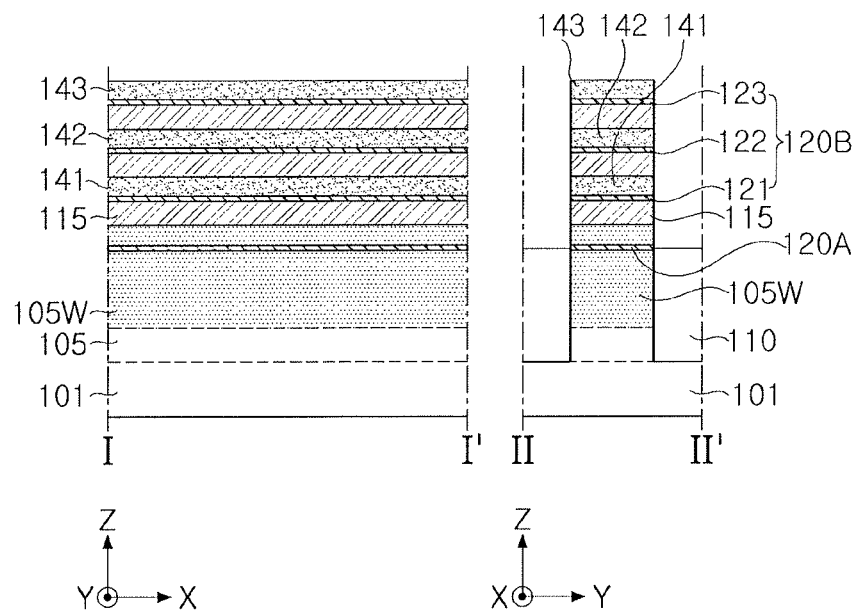

Referring to FIG. 11D, portions of the substrate 101, and portions of a stacked structure that includes the sacrificial layers 115, the first and second barrier layers 120A and 120B, and the channel layers 141, 142, and 143 may be removed to form active structures.

The active structure may include the sacrificial layers 115, the first and second barrier layers 120A and 120B, and the channel layers 141, 142, and 143 alternately stacked on each other, and may further include the active region 105 formed to protrude to the upper surface of the substrate 101 by removing a portion of the substrate 101. The active structures may be formed to have a linear shape extending in a direction, for example, the X direction, and may be spaced apart from each other in another direction, for example, the Y direction.

Regions in which the substrate 101 is partially removed may be filled with an insulating material, and the insulating material may then be partially removed in such a manner that the active region 105 protrudes, thereby forming the device isolation layers 110. Upper surfaces of the device isolation layers 110 may be lower than an upper surface of the active region 105.

Figure 11E:
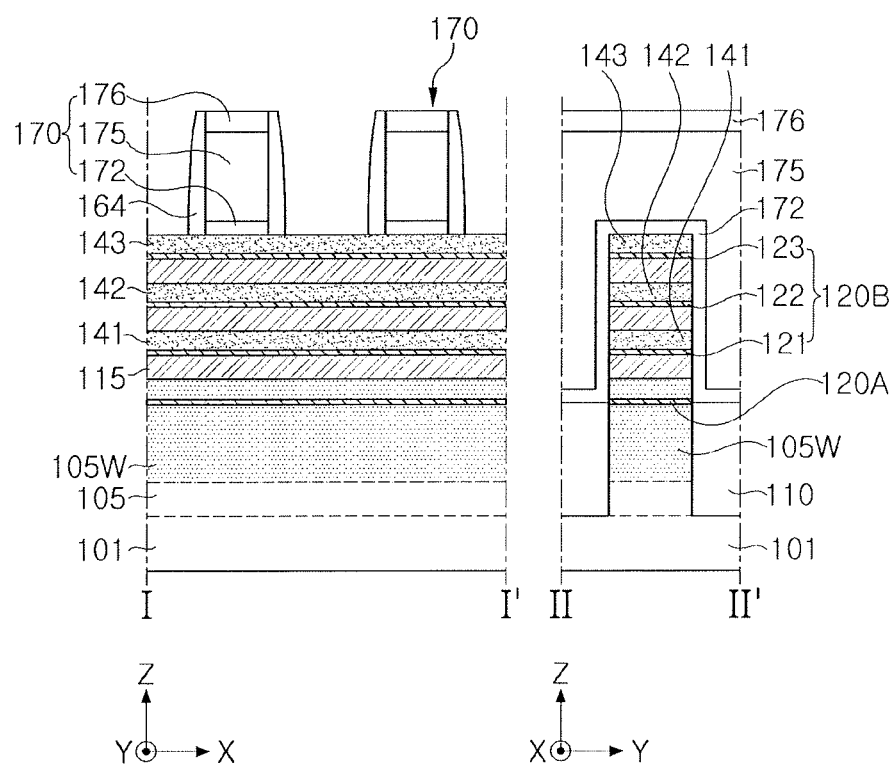

Referring to FIG. 11E, sacrificial gate structures 170 and the gate spacer layers 164 may be formed on the active structures.

The sacrificial gate structures 170 may be sacrificial structures formed in regions in which the gate dielectric layer 162 and the gate electrode 165 are disposed, on the channel structures 140, through a subsequent process, as illustrated in FIG. 2. The sacrificial gate structure 170 may include first and second sacrificial gate layers 172 and 175 and a mask pattern layer 176 that are sequentially stacked. The first and second sacrificial gate layers 172 and 175 may be patterned using the mask pattern layer 176. The first and second sacrificial gate layers 172 and 175 may be an insulating layer and a conductive layer, respectively, for example. The first and second sacrificial gate layers 172 and 175 may also be formed as a single layer. For example, the first sacrificial gate layer 172 may include silicon oxide, and the second sacrificial gate layer 175 may include polysilicon. The mask pattern layer 176 may include silicon oxide and/or silicon nitride. The sacrificial gate structures 170 may have a linear shape extending in one direction while intersecting the active structures. The sacrificial gate structures 170 may extend, for example, in the Y direction, and may be spaced apart from each other in the X direction.

The gate spacer layers 164 may be formed on both or opposite sidewalls of the sacrificial gate structures 170. The gate spacer layers 164 may be formed by performing anisotropic etching after forming a film having a uniform thickness along upper and side surfaces of the sacrificial gate structures 170 and the active structures. The gate spacer layers 164 may be formed of a low dielectric constant material and may include at least one of, for example, SiO, SiN, SiCN, SiOC, SiON, and SiOCN.

Figure 11F:
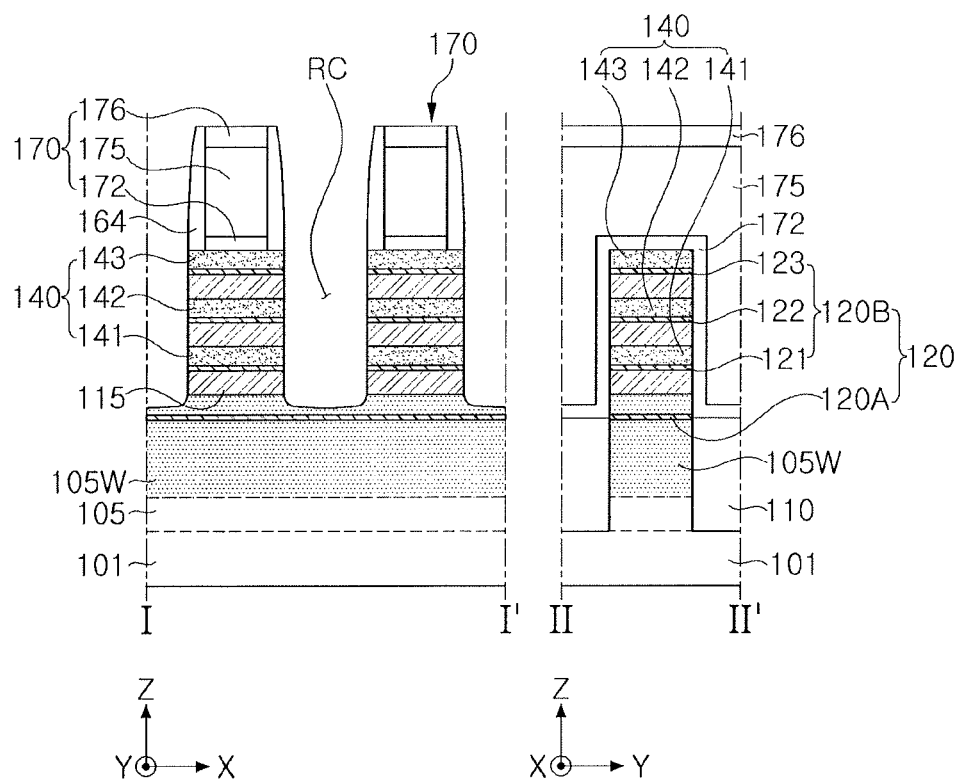

Referring to FIG. 11F, between the sacrificial gate structures 170, exposed sacrificial layers 115, second barrier layers 120B and channel layers 141, 142, and 143 may be removed to form a recess region RC, thereby forming the channel structures 140 and the barrier layer 120.

The exposed sacrificial layers 115, second barrier layers 120B, and channel layers 141, 142, and 143 may be removed using the sacrificial gate structures 170 and the gate spacer layers 164 as a mask. As a result, the channel layers 141, 142, and 143 may form the channel structure 140 while having a limited length in the X direction. The second barrier layers 120B may also have substantially the same width as that of the channel structure 140 in the X direction, and may form the barrier layer 120 together with the first barrier layer 120A. In another implementation, as in the example embodiment of FIG. 10B, below the sacrificial gate structures 170, the sacrificial layers 115 and the channel structure 140 may be partially removed from the sides such that both sides thereof in the X direction may be located below the sacrificial gate structures 170 and the gate spacer layers 164.

In the case of the example embodiment of FIG. 5, the recess region RC may be deeply formed in this operation in such a manner that the first barrier layer 120A may be divided between the sacrificial gate structures 170.

Figure 11G:
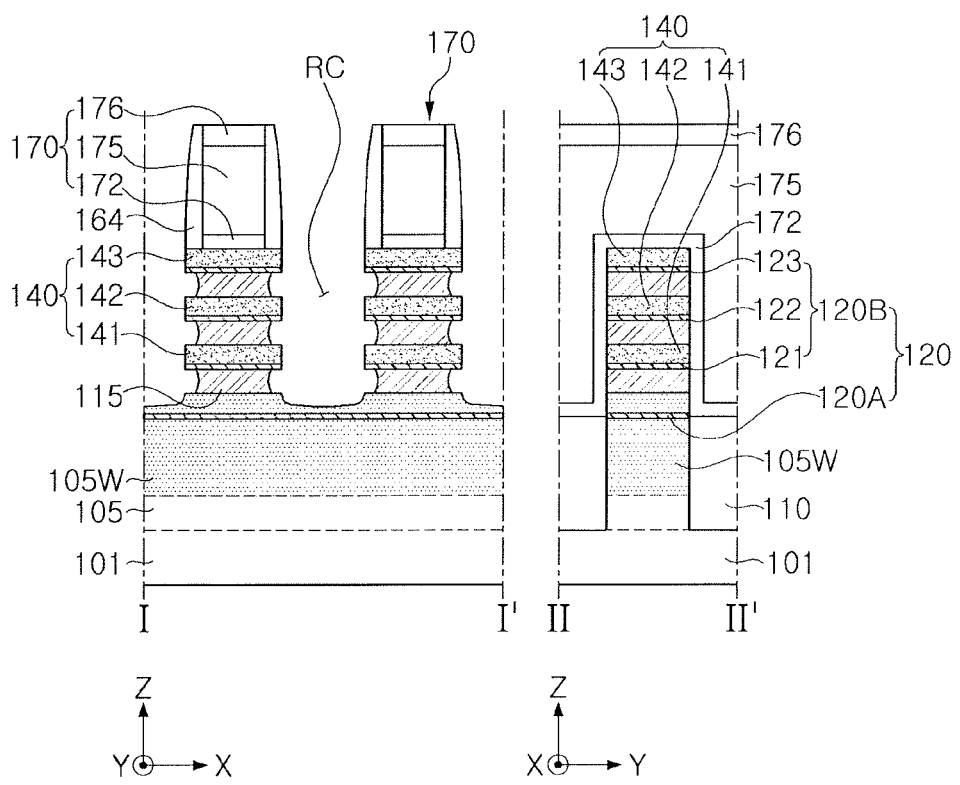

Referring to FIG. 11G, the exposed sacrificial layers 115 may be partially removed from a side surface thereof.

The sacrificial layers 115 may be selectively etched with respect to the channel structures 140 by, for example, a wet etching process so as to be removed to a predetermined depth from the side in the X direction. By the side etching, the sacrificial layers 115 may have side surfaces that are shaped to be concave inward, for example.

Figure 11H:
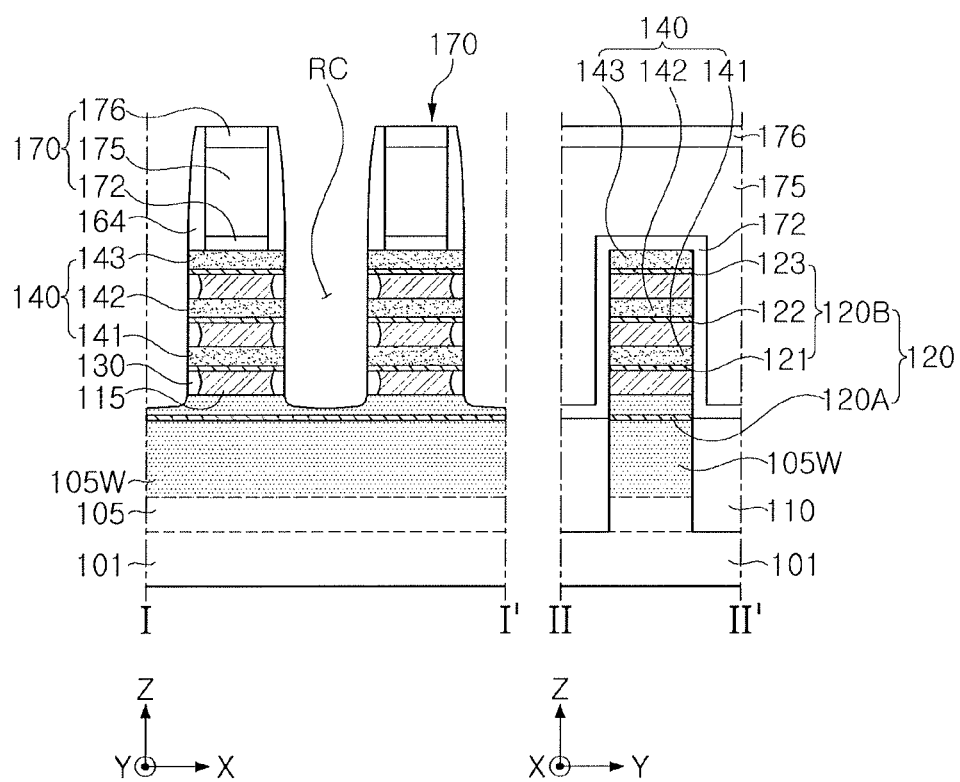

Referring to FIG. 11H, the internal spacer layers 130 may be formed in regions in which the sacrificial layers 115 have been removed.

The internal spacer layers 130 may be formed by filling regions from which the sacrificial layers 115 are removed with an insulating material, and removing insulating material that may be deposited on an outer side of the channel structures 140. The internal spacer layers 130 may be formed of the same material as that of the gate spacer layers 164, for example. The internal spacer layers 130 may include, for example, at least one of SiN, SiCN, SiOCN, SiBCN, and SiBN.

Figure 11I:
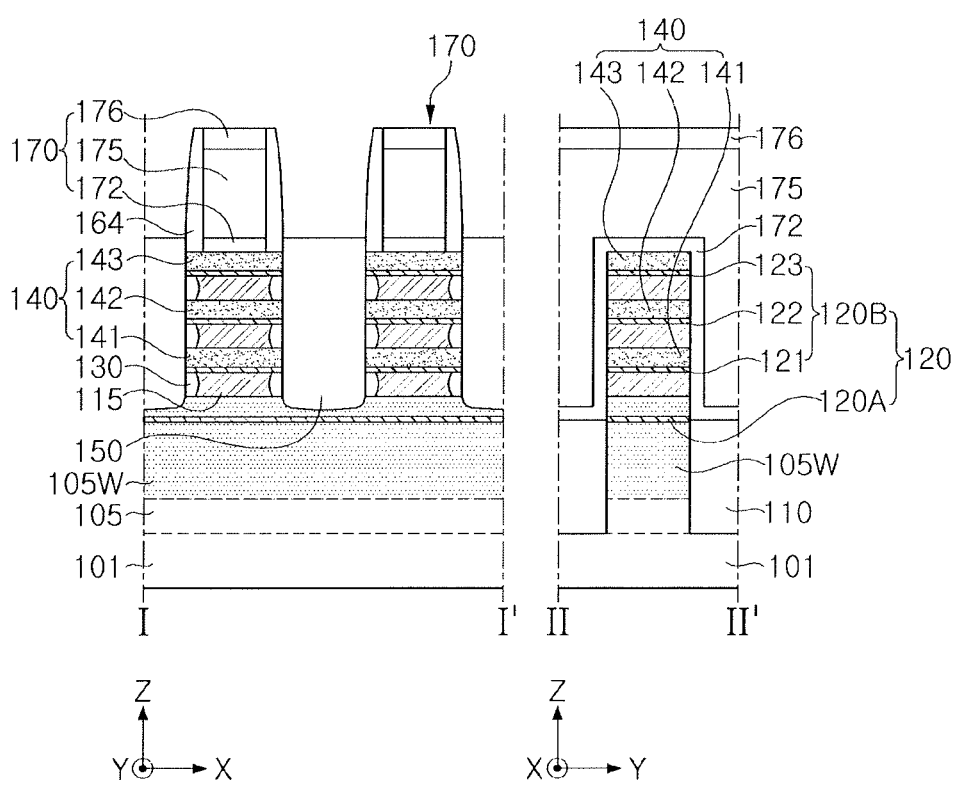

Referring to FIG. 11I, the source/drain regions 150 may be formed in the recess region RC on both sides of the sacrificial gate structures 170.

The source/drain regions 150 may be formed on the sides of the first to third channel layers 141, 142, and 143 and on the bottom of the recess region RC by the selective epitaxial growth process, on the active region 105. The source/drain regions 150 may include impurities by in-situ doping, and may also include a plurality of layers having different doping elements and/or doping concentrations.

Figure 11J:
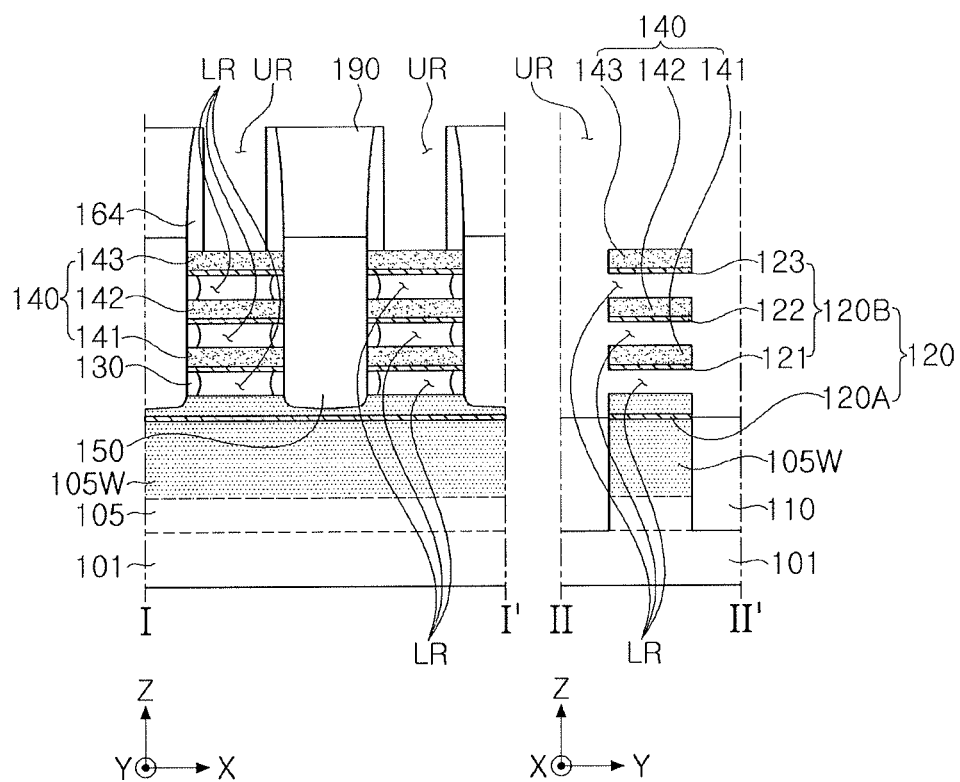

Referring to FIG. 11J, the interlayer insulating layer 190 may be formed, and the sacrificial layers 115 and the sacrificial gate structures 170 may be removed.

The interlayer insulating layer 190 may be formed by forming an insulating layer covering the sacrificial gate structures 170 and the source/drain regions 150, and then performing a planarization process.

The sacrificial layers 115 and the sacrificial gate structures 170 may be selectively removed with respect to the gate spacer layers 164, the interlayer insulating layer 190, the second barrier layers 120B, and the channel structures 140.

First, the sacrificial gate structures 170 may be removed to form upper gap regions UR, and then the sacrificial layers 115 exposed through the upper gap regions UR may be removed to form lower gap regions LR. For example, in the case in which the sacrificial layers 115 include silicon germanium (SiGe), the channel structures 140 include silicon (Si), and the second barrier layers 120B include silicon carbide (SiC), the sacrificial layers 115 may be selectively removed by performing a wet etching process using peracetic acid as an etchant. During the removal process, the source/drain regions 150 may be protected by the interlayer insulating layer 190 and the internal spacer layers 130.

Impurities in the impurity region 105W may be prevented from being diffused into the sacrificial layers 115 located thereon, by the barrier layer 120. Therefore, in this operation, the sacrificial layers 115 may not include impurities such as phosphorus (P) and may thus be effectively removed by an etching process. For example, as in the example embodiments of FIGS. 8 and 9, when the types of impurities in first and second regions R1 and R2 are different from each other, the effects of diffusion of the impurities may be different. In this case, if the barrier layer 120 is not present, the sacrificial layers 115 may be left without being removed due to impurities diffused in a relatively large amount in the first region R1. However, the barrier layer 120 may be disposed in the first region R1 as in the example embodiment of FIG. 9, or disposed in both the first and second regions R1 and R2 as in the example embodiment of FIG. 8. Thus, the sacrificial layers 115 may be simultaneously removed in the first and second regions R1 and R2 through one etching operation.

In addition, in the case of the example embodiment of FIG. 4, the second barrier layers 120B exposed through the upper gap regions UR may be removed by using a separate process or by adjusting the etching conditions after removing the sacrificial layers 115 in this operation.

Figure 11K:
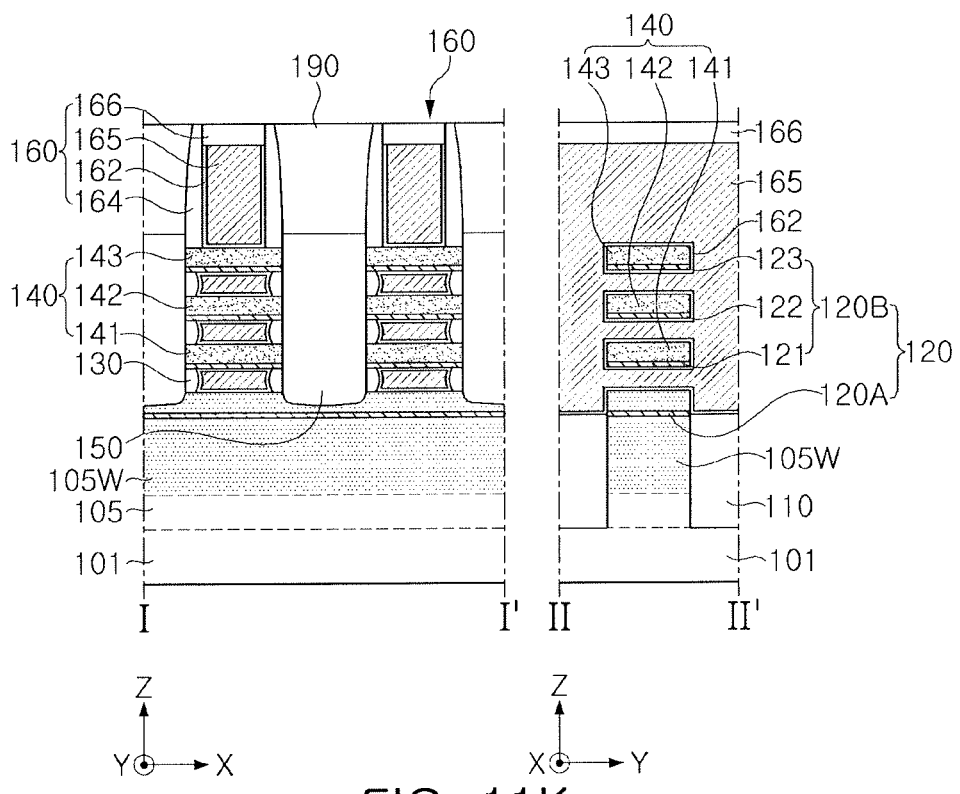

Referring to FIG. 11K, the gate structures 160 may be formed in the upper gap regions UR and the lower gap regions LR.

The gate dielectric layers 162 may be formed to conformally cover inner surfaces of the upper gap regions UR and the lower gap regions LR. The gate electrodes 165 may be formed to completely fill the upper gap regions UR and the lower gap regions LR, and then may be removed to a predetermined depth from the upper portion in the upper gap regions UR. The gate capping layer 166 may be formed in an area of the upper gate regions UR, in which the gate electrodes 165 have been removed. As a result, the gate structures 160 including the gate dielectric layer 162, the gate electrode 165, the gate spacer layers 164, and the gate capping layer 166 may be formed.

Next, referring to FIG. 2, the contact plug 180 may be formed.

First, a contact hole may be formed by patterning the interlayer insulating layer 190, and the contact plug 180 may be formed by filling the contact hole with a conductive material. A lower surface of the contact hole may be recessed into the source/drain regions 150 or may have a curve formed along the upper surface of the source/drain regions 150. In an example embodiment, the shape and arrangement of the contact plug 180 may be variously changed.

By way of summation and review, to reduce the limitations of operating characteristics of planar metal oxide semiconductor field effect transistors (MOSFETs) due to a reduction in the size thereof, a semiconductor device including a FinFET having a three-dimensional structure channel has been considered.

As set forth above, embodiments may provide a semiconductor device that includes barrier layers preventing diffusion of impurities, and has improved reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
an active region extending on a substrate in a first direction and including an impurity region;
a plurality of channel layers vertically spaced apart from each other on the active region;
a gate structure extending on the substrate in a second direction to intersect the active region and the plurality of channel layers, and surrounding the plurality of channel layers;
a source/drain region disposed on the active region on at least one side of the gate structure and in contact with the plurality of channel layers;
a barrier layer including a first barrier layer spaced apart from an upper surface of the substrate and being disposed in the impurity region, and second barrier layers respectively disposed below the plurality of channel layers; and
a contact plug connected to the source/drain region,
wherein:
the plurality of channel layers include a first channel layer, a second channel layer, and a third channel layer sequentially disposed from an upper surface of the substrate, and
the second barrier layers have a third thickness below the first channel layer and have a fourth thickness less than the third thickness below the second channel layer, respectively.

2. The semiconductor device as claimed in claim 1, wherein the first barrier layer extends along the active region in the first direction.

3. The semiconductor device as claimed in claim 1, wherein:
the gate structure includes first and second gate structures extending in parallel to each other,
the first barrier layer continuously extends along the active region, between the first and second gate structures, and
the second barrier layers are respectively divided between the first and second gate structures.

4. The semiconductor device as claimed in claim 1, wherein:
the second barrier layers are respectively disposed between the plurality of channel layers and the gate structure,
the gate structure has a first surface in contact with one of the second barrier layers, and
the gate structure has a second surface opposing the first surface and in contact with one of the plurality of channel layers.

5. The semiconductor device as claimed in claim 1, wherein:
the first barrier layer has a first thickness in a direction perpendicular to an upper surface of the substrate, and
the third thickness and the fourth thickness of the second barrier layers, in the direction perpendicular to the upper surface of the substrate, are less than the first thickness.

6. The semiconductor device as claimed in claim 1, wherein:
the second barrier layers are disposed below the first and second channel layers, respectively, and
a lower surface of the third channel layer is in contact with the gate structure.

7. The semiconductor device as claimed in claim 1, wherein the barrier layer is an epitaxial layer grown from the active region.

8. The semiconductor device as claimed in claim 1, wherein a lattice constant of the second barrier layers is smaller than a lattice constant of the plurality of channel layers.

9. The semiconductor device as claimed in claim 1, wherein the barrier layer includes at least one of silicon carbide (SiC) and silicon germanium carbide (SiGeC).

10. The semiconductor device as claimed in claim 1, wherein:
the active region includes a first region on the first barrier layer and a second region below the first barrier layer, and
a maximum concentration of impurities in the first region is lower than a maximum concentration of impurities in the second region.

11. The semiconductor device as claimed in claim 1, wherein the first barrier layer is disposed at a height that is lower than a lower end of the source/drain region.

12. The semiconductor device as claimed in claim 1, wherein the impurity region includes phosphorus (P), and the barrier layer includes a material that blocks diffusion of phosphorus (P).

13. A semiconductor device, comprising:
a substrate including a first impurity region having first impurities of a first conductivity type, and a second impurity region including second impurities of a second conductivity type;
a plurality of channel layers disposed to be vertically spaced apart from each other on each of the first and second impurity regions;
first and second gate structures extending in one direction and intersecting the plurality of channel layers on each of the first and second impurity regions, and surrounding the plurality of channel layers;
a first barrier layer disposed inside at least one of the first and second impurity regions and spaced apart from an upper surface of the substrate; and
a second barrier layer disposed below at least one of the plurality of channel layers, above the first barrier layer,
wherein:
the first impurities have a diffusivity higher than a diffusivity of the second impurities in the substrate, and
the first barrier layer is disposed in the first impurity region and is not disposed in the second impurity region.

14. The semiconductor device as claimed in claim 13, wherein the first barrier layer and the second barrier layer extend to have different lengths in a first direction parallel to the upper surface of the substrate.

15. The semiconductor device as claimed in claim 14, wherein the first barrier layer and the second barrier layer extend to have substantially the same length in a second direction parallel to the upper surface of the substrate and perpendicular to the first direction.

16. A semiconductor device, comprising:
- an active region extending on a substrate in a first direction and including an impurity region having first impurities;
- a channel layer disposed on the active region;
- a gate structure extending on the substrate in a second direction while intersecting the active region and the channel layer, the gate structure including a gate dielectric layer and a gate electrode layer;
- a first barrier layer disposed in the active region to extend in the first direction, and including second impurities; and
- a second barrier layer disposed below at least a portion of the channel layer and including the second impurities.

17. The semiconductor device as claimed in claim 16, wherein the first barrier layer and the second barrier layer extend to have different lengths in at least one direction.

* * * * *